(12) United States Patent
Besten

(10) Patent No.: US 8,004,430 B2
(45) Date of Patent: Aug. 23, 2011

(54) CODING SCHEME FOR SERIAL DATA COMMUNICATIONS

(75) Inventor: Gerrit Willem Besten, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 318 days.

(21) Appl. No.: 12/160,783

(22) PCT Filed: Jan. 11, 2007

(86) PCT No.: PCT/IB2007/050080
§ 371 (c)(1),
(2), (4) Date: Jul. 12, 2008

(87) PCT Pub. No.: WO2007/080547
PCT Pub. Date: Jul. 19, 2007

(65) Prior Publication Data
US 2010/0164760 A1    Jul. 1, 2010

(30) Foreign Application Priority Data
Jan. 12, 2006  (EP) .................................... 06100308

(51) Int. Cl.
*H04B 14/04* (2006.01)
(52) U.S. Cl. .......................................... 341/59; 375/242
(58) Field of Classification Search ............... 341/59, 341/58, 57, 50, 95; 375/19, 25, 242; 358/141, 358/261; 369/103, 124
See application file for complete search history.

(56) References Cited

U.S. PATENT DOCUMENTS

| | | | | |
|---|---|---|---|---|
| 4,602,152 A | * | 7/1986 | Dittakavi ................. | 235/462.07 |
| 4,775,985 A | * | 10/1988 | Busby .......................... | 375/242 |
| 5,808,998 A | * | 9/1998 | Curtis et al. ................. | 369/103 |
| 6,147,963 A | * | 11/2000 | Walker et al. ................. | 370/200 |
| 6,229,458 B1 | | 5/2001 | Altekar et al. | |
| 6,492,918 B1 | | 12/2002 | Rezzi et al. | |

FOREIGN PATENT DOCUMENTS

| | | |
|---|---|---|
| EP | 0310041 A | 4/1989 |
| JP | 2001144622 A | 5/2001 |
| JP | 2003514341 T | 4/2003 |

(Continued)

OTHER PUBLICATIONS

Bergmans M et al; "Antiwhistle Codes", IEEE Transactions on Communications, IEEE Service Center, Piscataway, NJ, US, vol. 45, No. 8, Aug. 1997.

A.X. Widmer, et al., "A DC-Balanced, Partitioned-Block, 8B/10B Transmission Code", IBM J. Res. Develop., vol. 27, No. 5, Sep. 1983, pg. 440-451.

*Primary Examiner* — Joseph Lauture

(57) ABSTRACT

An encoding scheme generates an encoded nine bit code word from each input eight bit data word. The coding scheme is such that the encoded data words have advantageous properties, such as a minimum of two polarity transitions in each encoded data word, and a maximum of five bits without a polarity transition. Five of the bits from the input eight bit data word appear unchanged in the encoded data word, while the other four bits of the encoded data word are obtained by applying appropriate logical operators to the remaining three bits of the input data word in combination with two of the five bits that appear unchanged in the encoded data word. Exception codes can also be defined, that is, nine bit code words that cannot be obtained from any eight bit data word by means of the coding scheme, and can be used to embed control information into the data stream. For example, the exception codes may advantageously have six or seven bits without a polarity transition.

34 Claims, 1 Drawing Sheet

FOREIGN PATENT DOCUMENTS

| | | |
|---|---|---|
| JP | 2003-273742 A | 9/2003 |
| JP | 2004-220698 A | 8/2004 |
| WO | WO 96/36130 A1 | 11/1996 |
| WO | WO 01/37279 A1 | 5/2001 |

* cited by examiner

CODING SCHEME FOR SERIAL DATA COMMUNICATIONS

This invention relates to a coding scheme, and in particular to a coding scheme that can be used when transmitting data and embedded information in a single data stream.

There are many situations in which it is necessary to transmit data from one electronic device to another. It may be advantageous to use a serial interface, in which the data for transmission is converted into a sequence of binary values; which are then transmitted over the interface.

In such situations, the use of a coding scheme can allow additional features into the data stream during transmission.

Various coding schemes are already known. Based on the fact that the original user data is provided in data bytes, each containing 8 data bits, coding schemes are known in which the data bits from one or more data bytes are manipulated in some way to produce encoded data containing one or more additional data bits. For example, U.S. Pat. No. 6,229,458 describes a coding scheme in which a data word made up of four data bytes (that is, 32 data bits) is encoded to form an encoded data word made up of 34 data bits.

According to a first aspect of the present invention, there is provided a method of encoding data, as defined in the attached claims. According to a second aspect of the invention, there is provided a method of decoding received encoded data. According to a third aspect of the invention, there is provided a transmitter for encoding data in accordance with the encoding method of the invention. According to a fourth aspect of the invention, there is provided a receiver for decoding data in accordance with the decoding method of the invention.

For a better understanding of the present invention, and to show how it may be put into effect, reference will now be made, by way of example, to the accompanying drawings, in which.

Figure 1:
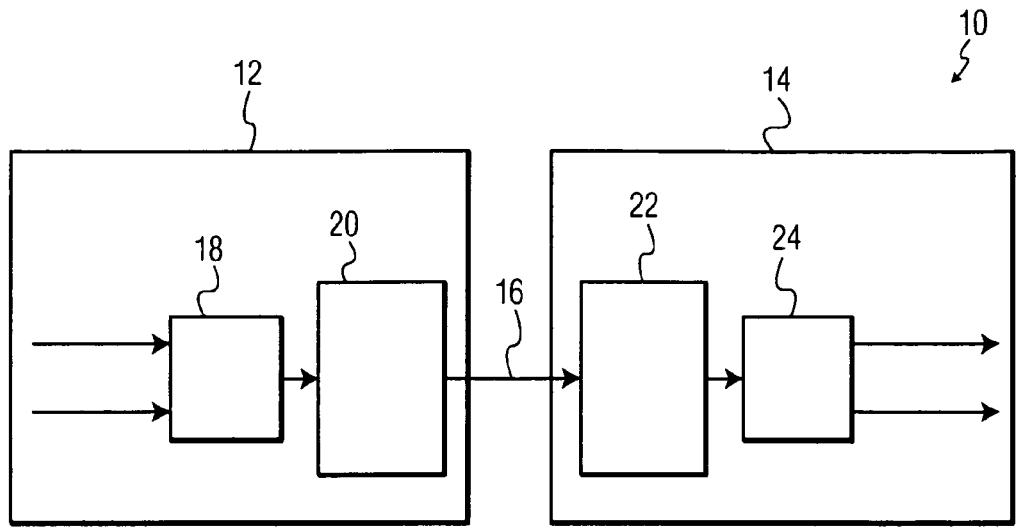
FIG. 1 is a block schematic diagram of a communications system embodying the present invention.

FIG. 1 is a block schematic diagram of a communications system 10, in which a transmitter 12 is connected to a receiver 14 by means of a connection 16. For example, the transmitter 12 and the receiver 14 may be separate devices located within a larger device. As one specific example, the transmitter may be an application engine or a baseband processor within a mobile device, while the receiver 14 may be a graphics processor or another application specific device, although it will be appreciated that the coding scheme of the invention may be used regardless of the types of device involved.

In the transmitter 12, user data may be obtained from any process or application, for transmission to the receiver 14. The user data is passed to an encoder 18 for encoding, as described in more detail below, and the encoded data is passed to a transmit interface 20, which performs any processes required to put the encoded data into the form desired for transmission over the connection 16.

The encoder 18 also receives control information, for example in the form of control flags, that is intended to be embedded in the stream of data for transmission. Again, this will be described in more detail below.

In the receiver 14, the data is received at an interface 22, and passed to a decoder 24 for decoding. The interface 22 performs any processes required to retrieve the encoded data, and the decoder extracts the control information embedded in the transmitted data stream, and recreates the original user data from the encoded data, so that the recreated original user data can be passed to any subsequent process or application, for further processing.

As described in more detail below, the user data is received in the form of data bytes, each containing eight data bits. Each of these data bytes is converted into a sequence of nine encoded data bits.

Figure 2:
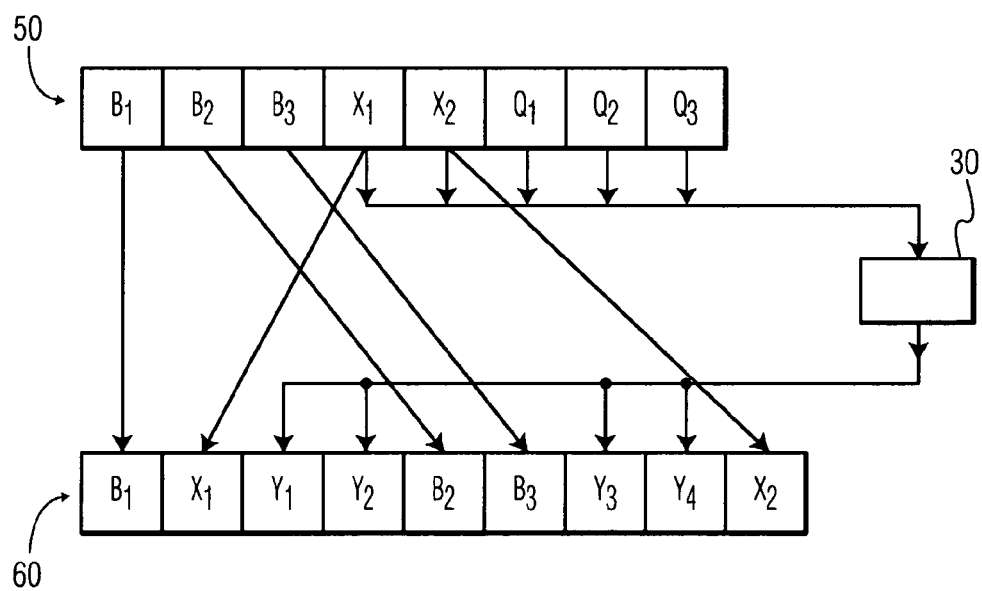
FIG. 2 illustrates the coding scheme according to an aspect of the present invention.

FIG. 2 illustrates the encoding scheme in more detail.

Specifically, as shown in FIG. 2, the eight data bits of a byte 50 of user data are identified as [B1, B2, B3, X1, X2, Q1, Q2, Q3]. In fact, this can be obtained by means of any arbitrary bijective (eight bits to eight bits) logical transformation of the input data byte, provided that the inverse function is available at the receiver side. For example, the eight data bits of the byte 50 can be an arbitrary permutation of the input data byte, where additionally each bit position can be inverted or not, compared to its source bit in the data byte, provided that the permutation and the inversions are known in advance, and can be reversed in the receiver. However, other bijective, reversible, transformations are also possible.

In the encoding process according to one embodiment of the invention, three of the bits of the input data byte appear unchanged in the encoded data word. The other six bits of the encoded data word form two blocks of three bits, separated by two of these unchanged bits. More specifically, in the encoding process as shown in FIG. 2, three of the bits of the input data byte, namely the bits identified as B1, B2 and B3, appear unchanged in the first, fifth and sixth bit positions respectively of the encoded data word 60. Two further bits of the input data byte, namely the bits identified as X1 and X2, appear unchanged in the second and ninth bit positions respectively of the encoded data word 60.

Further, in the encoding process, as shown in FIG. 2, the bits Q1, Q2 and Q3 of the input data byte are encoded in a logic block 30, also using the bits X1 and X2 of the input data byte, to form the bits Y1, Y2, Y3 and Y4 appearing in the third, fourth, seventh and eighth bit positions respectively of the encoded data word.

As mentioned previously, one of the purposes of such an encoding technique is to ensure that the encoded data words have certain desirable properties.

For example, it can be advantageous to provide a coding scheme in which is guaranteed that there will be a certain minimum number of polarity transitions in each encoded data word.

Further, it can be advantageous to provide a coding scheme in which there is a guaranteed maximum run length, that is, a guarantee that there will not be more than a predetermined number of identical bits, either within an encoded data word, or extending across two or more consecutive encoded data words.

According to the preferred embodiment of the present invention, the coding scheme operates such that there is guaranteed to be a first polarity change either between the second and third bits of the encoded data word, or between the third and fourth bits of the encoded data word, and such that there is guaranteed to be a second polarity change either between the seventh and eighth bits of the encoded data word, or between the eighth and ninth bits of the encoded data word, while excluding the possibility that the first polarity change is between the second and third bits of the encoded data word while the second polarity change is between the eighth and ninth bits of the encoded data word.

This guarantees that there are at least two polarity changes in each encoded data word, and also guarantees that every serialized stream of encoded data words has a maximum run length of five bits.

This could also be achieved in an equivalent manner by guaranteeing that there is a first polarity change either between the first and second bits of the encoded data word, or between the second and third bits of the encoded data word, and guaranteeing that there is a second polarity change either between the sixth and seventh bits of the encoded data word, or between the seventh and eighth bits of the encoded data word, while excluding the possibility that the first polarity change is between the first and second bits of the encoded data word while the second polarity change is between the seventh and eighth bits of the encoded data word. For example, this can be achieved by shifting the bit identified as B1 to the ninth bit position of the encoded data word 60, and shifting each of the other bits in the encoded data word 60 one position to the left.

The stated guarantees can be obtained by using the following coding table:

| $Q_1 Q_2 Q_3$ | $X_1$ | $Y_1 Y_2$ | | $Y_3 Y_4$ | $X_2$ | Note |
|---|---|---|---|---|---|---|
| 110 | dnc | 01 | 1 × 3 | 11/00 | 0/1 | Y3 = Y4 = not (X2) |
| 010 | | | | 01 | dnc | |
| 100 | | | | 10 | dnc | |
| 111 | dnc | 10 | 1 × 3 | 11/00 | 0/1 | Y3 = Y4 = not (X2) |
| 011 | | | | 01 | dnc | |
| 101 | | | | 10 | dnc | |
| 000 | 0/1 | 11/00 | 1 × 2 | 01 | dnc | Y1 = Y2 = not (X1) |
| 001 | | | | 10 | dnc | Y1 = Y2 = not (X1) |

As a result, in the preferred embodiment, the logic block 30 applies the following logical relationships to obtain the required bits of the output data word:

$$Y1 = (\sim Q1 \& \sim Q2 \& \sim X1) | (Q1 \& Q3) | (Q2 \& Q3)$$

$$Y2 = (\sim Q1 \& \sim Q2 \& \sim X1) | (Q1 \& \sim Q3) | (Q2 \& \sim Q3)$$

$$Y3 = (Q1 \& \sim Q2) | (Q1 \& Q2 \& \sim X2) | (\sim Q2 \& Q3)$$

$$Y4 = (\sim Q1 \& Q2) | (Q1 \& Q2 \& \sim X2) | (\sim Q1 \& \sim Q3),$$

where AND='&', OR='|', and NOT='~'.

Thus, the logic block 30 only requires a relatively small number of simple logic functions, and does not require any complex calculations.

This encoding scheme therefore provides encoded data words having desirable properties.

Moreover, it allows various unique exception/escape codes to be defined. These codes can be inserted into the data stream, as described above, to embed control information into the transmitted data.

In particular, a first group of these exception codes are referred to as "comma codes". As described above, the 9 bit encoded data words obtained from all of the possible 8 bit input data words can be guaranteed to have a maximum run length of five bits. However, 9 bit code words with longer run lengths can be defined, and these can be inserted into a data stream for special purposes, that is, not representing data. For example, as is known to the person skilled in the art, these 9 bit code words with longer run lengths can be used for performing synchronization, for synchronization checks, to identify the beginning and end of data packets, to insert skip and/or idle codes, and some error checking capabilities.

In particular, it is possible to define a number of 9 bit code words that contain specific bit sequences that can be guaranteed not to appear anywhere within any serialized sequence of encoded data words obtained from possible 8 bit input data words. Codes with this property are referred to as "comma codes". This has the effect that, even if the receiver has not been synchronized with the transmitter, meaning that the receiver has not yet identified the beginning and end of each transmitted 9 bit word, the receiver is able to identify these specific bit sequences, and then use its knowledge about these specific bit sequences to achieve synchronization.

In fact, based on the coding scheme described above, where the bit identified as B1 appears as the first bit in the encoded data word, and there is guaranteed to be a first polarity change either between the second and third bits of the encoded data word, or between the third and fourth bits of the encoded data word, and there is guaranteed to be a second polarity change either between the seventh and eighth bits of the encoded data word, or between the eighth and ninth bits of the encoded data word, while excluding the possibility that the first polarity change is between the second and third bits of the encoded data word while the second polarity change is between the eighth and ninth bits of the encoded data word, there are at least four ways to define four unique exception codes with a runlength of 6 bits. There are also two exception codes with a runlength of 7 bits and two exception codes that can be combined with subsequent valid codewords to produce bit sequences with a runlength of at least 8 bits, but may result in bit sequences with a runlength of up to 11 bits, depending on the subsequent code word.

The four ways of defining four unique exception codes with a runlength of 6 bits are listed in the following table, identified as Options 1-4:

| Maximum Runlength | Exception Codes Option 1 | Exception Codes Option 2 | Exception Codes Option 3 | Exception Codes Option 4 |
|---|---|---|---|---|
| 6 | 100000010 | 001111110 | 001111110 | 010000001 |
|   | 100000011 | 010000001 | 100000010 | 011111100 |
|   | 011111101 | 101111110 | 100000011 | 011111101 |
|   | 011111100 | 110000001 | 101111110 | 110000001 |
| 7 | 100000001 | 100000001 | 100000001 | 100000001 |
|   | 011111110 | 011111110 | 011111110 | 011111110 |
| 11 | 100000000 | 100000000 | 100000000 | 100000000 |
|   | 011111111 | 011111111 | 011111111 | 011111111 |

It should be noted that the exception codes in the last of these three categories can be flipped; that is, the code 100000000 can be replaced by 000000001, and 011111111 can be replaced by 111111110. In that case, sequences with a runlength of up to 10 bits may be obtained, depending on the preceding code word, in the case where the bit identified as B1 appears as the first bit in the encoded data word.

In the alternative described above, where the bit identified as B1 appears as the ninth bit in the encoded data word, and there is guaranteed to be a first polarity change either between the first and second bits of the encoded data word, or between the second and third bits of the encoded data word, and there is also guaranteed to be a second polarity change either between the sixth and seventh bits of the encoded data word, or between the seventh and eighth bits of the encoded data word, while excluding the possibility that the first polarity change is between the first and second bits of the encoded data word while the second polarity change is between the seventh and eighth bits of the encoded data word, the exception codes in the last of these three categories may result in bit sequences with a runlength of up to 10 bits, depending on the subsequent code word. Again, however, the exception codes in the last of these three categories can be flipped, as described above, and, in that case, sequences with a runlength of up to 11 bits may be obtained, depending on the preceding code word.

If the exception codes can be guaranteed to have a polarity transition between the first and second bits, then it becomes easy to achieve alignment based on the exception codes, which means that option 1 is the preferred solution. That is, if the exception codes listed in the table as Option 1 are used, then, when the receiver detects six consecutive bits with the same bit value, it will know that this indicates that one of the exception codes has been transmitted. Moreover, since each of the exception codes has a polarity transition between the first and second bits, (and each of the exception codes with a runlength of 6 also has a polarity transition between the seventh and eighth bits), the receiver can identify the start and the end of the exception code word, and can then use this to identify the start and the end of each subsequent received code word.

Because the two codes in the last runlength category can cause a significantly higher maximum possible runlength, it is attractive to limit usage of exception codes to the first two runlength categories with maximum runlengths of 6 and 7 respectively. If four exception codes are sufficient, the overall maximum runlength can be limited to 6.

A further category of exception codes can be defined. Specifically, these are the code words where there is a first polarity change between the second and third bits of the encoded data word, and a second polarity change between the eighth and ninth bits of the encoded data word, but the third and fourth bits are equal, as are the seventh and eighth bits, while the third and eighth bits (and hence also the fourth and seventh bits) have opposite polarities.

These code words therefore have the form:

B1, 1, 0, 0, B2, B3, 1, 1, 0 or
B1, 0, 1, 1, B2, B3, 0, 0, 1.

It can be seen that there are two possible forms for these code words and, in each case, B1, B2 and B3 can take any values, giving eight possible combinations, leading to 16 of these code words in total.

Again, these exception codes can be used to embed control information into the data stream, as required. However, the exception codes of this category are not unique, as the bit sequences can also appear in a sliding window across the boundary between two consecutive encoded data words, and so these code words can only be used once synchronization has been achieved, that is, once the receiver knows where each received code word begins and ends.

The exception codes can be stored in the encoder 18, or elsewhere, and can then simply be inserted complete into the data stream for transmission. Alternatively, encoding logic can be provided for generating the exception codes from received control information. After encoding, and insertion of any required exception codes, the data stream can be transmitted to the decoder 24. In the decoder 24, it is first necessary to recognize and remove any exception codes that were inserted into the data stream.

For example, exception codes with runlengths greater than 5 can be identified simply by the presence of these runlengths. The regular exception codes can for example be recognized by identifying that the third and fourth bits are equal, as are the seventh and eighth bits, while the third and eight bits (and hence also the fourth and seventh bits) have opposite polarities. The control information corresponding to any extracted exception codes can then be passed on to a further control process.

Any other code words, representing encoded data words, can be decoded. It is clear from the discussion of the encoder 18 above that the bits B1, B2, B3, X1 and X2 appearing in the encoded data word do not need to be decoded, as they were unchanged by the encoding process.

It should also be noted that, although the bits Y1, Y2, Y3 and Y4 of the encoded data word were obtained from the bits Q1, Q2 and Q3 of the input data byte, also using the bits X1 and X2 of the input data byte, it is possible to decode the bits Y1, Y2, Y3 and Y4 of the encoded data word to the required bits Q1, Q2 and Q3 of the decoded data byte, without also using the bits X1 and X2.

The received nine bit code word is therefore divided into a first group, containing the five bits B1, B2, B3, X1 and X2 that do not need to be decoded, and a second group, containing the four bits Y1, Y2, Y3 and Y4, it being noted that the first group of bits are not the first five bits in the received code word, and the second group of bits are not the last four bits in the received code word.

Specifically, the logical relation for decoding is:

$$Q1 = EXOR(Y1, Y2) \& \sim(\sim Y3 \& Y4)$$

$$Q2 = EXOR(Y1, Y2) \& \sim(Y3 \& \sim Y4)$$

$$Q3 = (Y1 \& \sim Y2) | (Y1 \& Y2 \& Y3) | (\sim Y1 \& \sim Y2 \& Y3)$$

$$= (Y1 \& \sim Y2) | (\sim EXOR(Y1, Y2) \& Y3)$$

where AND='&', OR='|', and NOT='~'.

Thus, the decoder 24 only requires a relatively small number of simple logic functions, and does not require any complex calculations.

Finally, in order to obtain the output data byte, this decoded data word must undergo a process to reverse any bijective transformation, such as any permutation and/or inversions that were applied to the input data byte before encoding.

There is therefore described a method for encoding data, which can provide encoded data having desirable properties, while also providing the possibility of useful exception codes, without causing an undesirably large increase in the amount of data to be transmitted.

The invention claimed is:

1. A method of encoding data, the method comprising, for each input data byte of eight bits:
   dividing the data byte into:
      a first group of three bits, and
      a second group of five bits; and
   generating an output data word containing nine bits, wherein the nine bits include the first group of three bits from the input data byte, and wherein each possible output data word has a maximum runlength of 5 bits; and
   the method further comprising:
   dividing the second group of five bits into two unencoded bits and three encoded bits;
   wherein the nine bits of the output data word further include the two unencoded bits from the second group of five bits from the data byte; and
   wherein generating the output data word comprises:
      applying logical operators to the second group of five bits from the data byte to obtain four further bits of the output data word.

2. A method as claimed in claim 1, wherein the nine bits of the output data word comprise:
   the first group of three bits from the input data byte;
   the two unencoded bits from the second group of five bits of the input data byte;
   sixth and seventh bits obtained by applying logical operators to a first of the unencoded bits and the three encoded bits in the input data byte; and eighth and ninth bits obtained by applying logical operators to a second of the unencoded bits and the three encoded bits in the input data byte.

3. A method as claimed in claim 2, wherein the two unencoded bits from the second group of five bits from the input data byte, the sixth and seventh bits, and the eighth and ninth bits appear in two blocks of three consecutive bits in the output data word.

4. A method as claimed in claim 3, wherein the two unencoded bits from the second group of five bits from the input data byte, the sixth and seventh bits, and the eighth and ninth bits appear as the second, third and fourth, and seventh, eight and ninth bits in the output data word.

5. A method as claimed in claim 4, wherein, in each possible output data word, there is a first polarity transition between the second and third bits or between the third and fourth bits and a second polarity transition between the seventh and eighth bits or between the eighth and ninth bits, while excluding the possibility that the first polarity transition is between the second and third bits while the second polarity transition is between the eighth and ninth bits.

6. A method as claimed in claim 3, wherein the two unencoded bits from the second group of five bits from the input data byte, the sixth and seventh bits, and the eighth and ninth bits appear as the first, second and third, and sixth, seventh and eighth bits in the output data word.

7. A method as claimed in claim 6, wherein, in each possible output data word, there is a first polarity transition between the first and second bits or between the second and third bits and a second polarity transition between the sixth and seventh bits or between the seventh and eighth bits, while excluding the possibility that the first polarity transition is between the first and second bits while the second polarity transition is between the seventh and eighth bits.

8. A method as claimed in claim 3, wherein the two unencoded bits from the second group of five bits from the input data byte appear in different ones of the two blocks of three consecutive bits in the output data word.

9. A method as claimed in claim 2, wherein the logical operators are such that there are at least two polarity transitions in each possible output data word.

10. A method as claimed in claim 2, wherein the logical operators are such that there are at least two zeroes and at least two ones in each possible output data word.

11. A method as claimed in claim 2, comprising: applying logical operators to the first of the unencoded bits and the group of three encoded bits in the input data byte to obtain the sixth and seventh bits according to the logic:

Y1=(~Q1&~Q2&~X1)|(Q1&Q3)|(Q2&Q3)

Y2=(~Q1&~Q2&~X1)|(Q1&~Q3)|(Q2&~Q3)

and applying logical operators to the second of the unencoded bits and the group of three encoded bits in the input data byte to obtain the eighth and ninth bits according to the logic:

Y3=(Q1&~Q2)|(Q1&Q2&~X2)|(~Q2&Q3)

Y4=(~Q1&Q2)|(Q1&Q2&~X2)|(~Q1&~Q3), wherein X1 is the first of the two unencoded bits from the second group of five bits of the input data byte, X2 is the second of the two unencoded bits from the second group of five bits of the input data byte, Q1, Q2 and Q3 are the group of three encoded bits in the input data byte, Y1 and Y2 are the sixth and seventh bits of the output data word, and Y3 and Y4 are the eighth and ninth bits of the output data word, and where AND='&', OR='|', and NOT='~'.

12. A method of encoding data, the method comprising, for each input data byte of eight bits:
dividing the data byte into:
a first group of three bits, and
a second group of five bits; and
generating an output data word containing nine bits, wherein the nine bits include the first group of three bits from the input data byte, and wherein each possible output data word has a maximum runlength of 5 bits; and
wherein two unencoded bits from the second group of five bits from the input data byte appear in different ones of two blocks of three consecutive bits in the output data word.

13. A method of encoding data, the method comprising, for each input data byte of eight bits:
dividing the data byte into:
a first group of three bits, and
a second group of five bits; and
generating an output data word containing nine bits, wherein the nine bits include the first group of three bits from the input data byte, and wherein each possible output data word has a maximum runlength of 5 bits; and
wherein sixth and seventh bits appear in one of two blocks of three consecutive bits in the output data word, and eighth and ninth bits appear in another of the two blocks of three consecutive bits in the output data word.

14. A method of encoding data, the method comprising, for each input data byte of eight bits:
dividing the data byte into:
a first group of three bits, and
a second group of five bits; and
generating an output data word containing nine bits, wherein the nine bits include the first group of three bits from the input data byte, and wherein each possible output data word has a maximum runlength of 5 bits; and
applying logical operators to a first of two unencoded bits from the second group of five bits and a group of three encoded bits in the input data byte to obtain sixth and seventh bits according to the logic:

Y1=(~Q1&~Q2&~X1)|(Q1&Q3)|(Q2&Q3)

Y2=(~Q1&~Q2&~X1)|(Q1&~Q3)|(Q2&~Q3)

and applying logical operators to a second the two unencoded bits from the second group of five bits and the group of three encoded bits in the input data byte to obtain eighth and ninth bits according to the logic:

Y3=(Q1&~Q2)|(Q1&Q2&~X2)|(~Q2&Q3)

Y4=(~Q1&Q2)|(Q1&Q2&~X2)|(~Q1&~Q3), wherein X1 is the first of the two unencoded bits from the second group of five bits of the input data byte, X2 is the second of the two unencoded bits from the second group of five bits of the input data byte, Q1, Q2 and Q3 are the group of three encoded bits in the input data byte, Y1 and Y2 are the sixth and seventh bits of the output data word, and Y3 and Y4 are the eighth and ninth bits of the output data word, and where AND='&', OR='|', and NOT='~'.

15. A method of transmitting data from a transmitter to a receiver, the method comprising:
encoding the data by a method comprising, for each input data byte of eight bits:
dividing the data byte into:
a first group of three bits, and
a second group of five bits; and
generating an output data word containing nine bits, wherein the nine bits include the first group of three bits from the input data byte, and wherein each possible output data word has a maximum runlength of 5 bits; and
including amongst the encoded data at least one exception code, comprising a nine bit word that can not be obtained from any input data byte by encoding the data in accordance with the method.

16. A method as claimed in claim 15, wherein the exception code comprises a nine bit word having a runlength of 6 bits.

17. A method as claimed in claim 15, wherein the exception code comprises a nine bit word having a runlength of 7 bits.

18. A method as claimed in claim 15, wherein the exception code comprises a nine bit word having a runlength of 8 bits that, in combination with an adjacent encoded data word, can provide a runlength of up to 10 bits.

19. A method as claimed in claim 15, wherein the exception code comprises a nine bit word having a runlength of 8 bits that, in combination with an adjacent encoded data word, can provide a runlength of up to 11 bits.

20. A method as claimed in claim 15, wherein the exception code has a maximum runlength of 5 bits.

21. A method as claimed in claim 15, wherein, in the exception code, there is a first polarity change between the second and third bits of the word, and a second polarity change between the eighth and ninth bits of the word, but the third and fourth bits are equal, as are the seventh and eighth bits, while the third and eighth bits have opposite polarities.

22. A transmitter, for receiving data in input data bytes of eight bits, and comprising an encoder, the encoder comprising logic for encoding the received data by a method comprising, for each input data byte of eight bits:
    dividing the data byte into:
        a first group of three bits, and
        a second group of five bits; and
    generating an output data word containing nine bits, wherein the nine bits include the first group of three bits from the input data byte, and wherein each possible output data word has a maximum runlength of 5 bits; and
    the logic for encoding also:
    dividing the second group of five bits into two unencoded bits and three encoded bits;
    wherein the nine bits of the output data word further include the two unencoded bits from the second group of five bits from the data byte; and
    wherein generating the output data word comprises:
    applying logical operators to the second group of five bits from the data byte to obtain four further bits of the output data word.

23. A transmitter as claimed in claim 22, further comprising logic for including amongst the encoded data at least one exception code, comprising a nine bit word that can not be obtained from any input data byte by encoding the data in accordance with the method.

24. A transmitter as claimed in claim 23, wherein the exception code comprises a nine bit word having a runlength of 6 bits.

25. A transmitter as claimed in claim 23, wherein the exception code comprises a nine bit word having a runlength of 7 bits.

26. A transmitter as claimed in claim 23, wherein the exception code comprises a nine bit word having a runlength of 8 bits that, in combination with an adjacent encoded data word, can provide a runlength of up to 10 bits.

27. A transmitter as claimed in claim 23, wherein the exception code comprises a nine bit word having a runlength of 8 bits that, in combination with an adjacent encoded data word, can provide a runlength of up to 11 bits.

28. A transmitter as claimed in claim 23, wherein the exception code has a maximum runlength of 5 bits.

29. A transmitter, for receiving data in input data bytes of eight bits, and comprising an encoder, the encoder comprising logic for encoding the received data by a method comprising, for each input data byte of eight bits:
    dividing the data byte into:
        a first group of three bits, and
        a second group of five bits; and
    generating an output data word containing nine bits, wherein the nine bits include the first group of three bits from the input data byte, and wherein each possible output data word has a maximum runlength of 5 bits;
    the transmitter further comprising logic for including amongst the encoded data at least one exception code comprising a nine bit word that can not be obtained from any input data byte by encoding the data in accordance with the method; and
    wherein, in the exception code, there is a first polarity change between the second and third bits of the word, and a second polarity change between the eighth and ninth bits of the word, but the third and fourth bits are equal, as are the seventh and eighth bits, while the third and eighth bits have opposite polarities.

30. A method of decoding received encoded data, the method comprising, for each received encoded data word of nine bits:
    dividing the encoded data word into:
        a first group of five bits, and
        a second group of four bits; and
    generating an output word containing eight bits, wherein the eight bits comprise:
        the first group of five bits from the encoded data word; and
        sixth, seventh and eighth bits obtained by applying logical operators to the second group of four bits in the encoded data word.

31. A method as claimed in claim 30, comprising applying the logical operators such that:

$$Q1 = EXOR(Y1, Y2) \& \sim(\sim Y3 \& Y4)$$

$$Q2 = EXOR(Y1, Y2) \& \sim(Y3 \& \sim Y4)$$

$$Q3 = (Y1 \& \sim Y2) | (Y1 \& Y2 \& Y3) | (\sim Y1 \& \sim Y2 \& Y3)$$

$$= (Y1 \& \sim Y2) | (\sim EXOR(Y1, Y2) \& Y3),$$

wherein Y1, Y2, Y3 and Y4 are the second group of four bits in the encoded data word; Q1, Q2 and Q3 are the sixth, seventh and eighth bits of the output word; and where AND='&', OR='|', and NOT='~'.

32. A method as claimed in claim 30, further comprising recognizing and removing any exception codes.

33. A receiver, for receiving encoded data in encoded data words each of nine bits, and comprising a decoder, the decoder comprising logic for decoding the received data by, for each received encoded data word of nine bits:
    dividing the encoded data word into:
        a first group of five bits, and
        a second group of four bits; and
    generating an output word containing eight bits, wherein the eight bits comprise:
        the first group of five bits from the encoded data word; and
        sixth, seventh and eighth bits obtained by applying logical operators to the second
    group of four bits in the encoded data word.

34. A receiver as claimed in claim 33, further comprising logic for recognizing and removing any exception codes before passing the encoded data to the decoder, and outputting control information represented by the exception codes.

* * * * *